United States Patent
Hanamachi et al.

(10) Patent No.: US 12,247,296 B2
(45) Date of Patent: Mar. 11, 2025

(54) MEMBER FOR PLASMA PROCESSING DEVICE

(71) Applicants: NHK Spring Co., Ltd., Yokohama (JP); IZUMI TECHNO INC., Okaya (JP)

(72) Inventors: Toshihiko Hanamachi, Kanagawa (JP); Shuhei Morota, Kanagawa (JP); Go Takahara, Kanagawa (JP); Masaru Takimoto, Kanagawa (JP); Hibiki Yokoyama, Kanagawa (JP); Hiroshi Mitsuda, Kanagawa (JP); Yoshihito Araki, Kanagawa (JP); Kengo Ajisawa, Nagano (JP)

(73) Assignees: NHK Spring Co., Ltd., Yokohama (JP); IZUMI TECHNO INC., Okaya (JP)

( * ) Notice: Subject to any disclaimer, the term of this patent is extended or adjusted under 35 U.S.C. 154(b) by 739 days.

(21) Appl. No.: 17/259,609

(22) PCT Filed: Jul. 17, 2019

(86) PCT No.: PCT/JP2019/028164
§ 371 (c)(1),
(2) Date: Jan. 12, 2021

(87) PCT Pub. No.: WO2020/017566
PCT Pub. Date: Jan. 23, 2020

(65) Prior Publication Data
US 2021/0292911 A1   Sep. 23, 2021

(30) Foreign Application Priority Data
Jul. 18, 2018 (JP) .................. 2018-135083

(51) Int. Cl.
C23C 28/04 (2006.01)

(52) U.S. Cl.
CPC .................. *C23C 28/04* (2013.01)

(58) Field of Classification Search
None
See application file for complete search history.

(56) References Cited

U.S. PATENT DOCUMENTS

| 7,780,786 B2 | 8/2010 | Mitsuhashi et al. |
| 8,449,715 B2 | 5/2013 | Mitsuhashi et al. |

(Continued)

FOREIGN PATENT DOCUMENTS

| CN | 1511197 A | 7/2004 |
| CN | 1516535 A | 7/2004 |

(Continued)

OTHER PUBLICATIONS

MaterialDistrict, "KEPLA-COAT", Nov. 27, 2012, accessed online Jun. 20, 2024 at materialdistrict.com/material/kepla-coat (Year: 2012).*

(Continued)

*Primary Examiner* — Kim S. Horger
(74) *Attorney, Agent, or Firm* — Troutman Pepper Locke LLP

(57) ABSTRACT

A member for a plasma processing device includes: an aluminum base material; and an oxide film formed on the aluminum base material and having a porous structure, the oxide film including a first oxide film formed on a surface of the aluminum base material, a second oxide film formed on the first oxide film, and a third oxide film formed on the second oxide film, wherein the first oxide film is harder than the second oxide film and the third oxide film, and a hole formed in each of the first oxide film, the second oxide film and the third oxide film is sealed.

7 Claims, 4 Drawing Sheets

(56) References Cited

U.S. PATENT DOCUMENTS

| | | |
|---|---|---|
| 8,739,732 B2 | 6/2014 | Nagayama et al. |
| 8,877,002 B2 | 11/2014 | Mitsuhashi et al. |
| 2004/0216667 A1 | 11/2004 | Mitsuhashi et al. |
| 2005/0103275 A1 | 5/2005 | Sasaki et al. |
| 2009/0104781 A1 | 4/2009 | Sasaki et al. |
| 2010/0307687 A1 | 12/2010 | Mitsuhashi et al. |
| 2013/0255881 A1 | 10/2013 | Mitsuhashi et al. |
| 2014/0120312 A1 | 5/2014 | He et al. |

FOREIGN PATENT DOCUMENTS

| | | | |
|---|---|---|---|
| CN | 101521145 A | | 9/2009 |
| CN | 104114752 A | | 10/2014 |
| JP | H11-229185 A | | 8/1999 |
| JP | H11229185 | * | 8/1999 |
| JP | 2000-114189 A | | 4/2000 |
| JP | 2004-260159 A | | 9/2004 |
| JP | 2007-321194 A | | 12/2007 |
| JP | 2009-185391 A | | 8/2009 |
| JP | 4430266 B2 | | 3/2010 |
| JP | 4987911 B2 | | 8/2012 |
| KR | 20040048343 A | | 6/2004 |
| KR | 10-2016-0033047 A | | 3/2016 |
| TW | I248991 B | | 2/2006 |
| TW | 201111557 | * | 4/2011 |
| TW | 201111557 A | | 4/2011 |
| TW | I373798 B | | 10/2012 |

OTHER PUBLICATIONS

Nakamura et al., "Effect of alumite surface treatments on long-life fatigue behavior of a cast aluminum in rotating bending", 2010, International Journal of Fatigue, vol. 32, pp. 621-626. (Year: 2010).*

Office Action dated Jan. 6, 2023, issued In the corresponding Chinese patent application No. 201980047802.9 and English translation thereof.

Supplementary European Search Report dated Feb. 16, 2022, issued for European Patent Application No. 19838458.8.

International Search Report mailed Sep. 24, 2019, issued for PCT/JP2019/028164.

Office Action mailed Mar. 14, 2022, issued for Korean Patent Application No. 10-2021-7001606 and English translation thereof.

Decision on Registration dated Aug. 12, 2022, issued for Korean Patent Application No. 10-2021-7001606 and English Machine translation thereof.

Office Action dated Feb. 8, 2021, issued for the corresponding Taiwan Patent Application No. 108124465 and English translation thereof.

* cited by examiner

| | POROUS DIAMETER (nm) | POROUS NUMBER (×10⁹/cm²) | POROSITY (%) | WITHSTAND VOLTAGE (kV/μm) BEFORE HEATING | WITHSTAND VOLTAGE (kV/μm) AFTER HEATING | IMAGE |
|---|---|---|---|---|---|---|
| EXAMPLE (THREE-LAYERED FILM) | 17 | 5.7 | 1.6 | 0.0652 | 0.0665 |  |
| COMPARATIVE EXAMPLE (SINGLE-LAYERED FILM) | 12 | 27.7 | 4 | 0.0374 | 0.03 |  |

MEMBER FOR PLASMA PROCESSING DEVICE

FIELD

The present invention relates to a member for a plasma processing device used for a plasma processing device.

BACKGROUND

In the past, as a member used for a plasma processing device, it was known a member for a plasma processing device that has an oxide film formed on an aluminum base material and has a sprayed film formed on this oxide film (for example, see Patent Literatures 1 and 2). By providing a sprayed film on an oxide film as described above, a member used for a plasma processing device improves plasma resistance.

Patent Literature 1 discloses a member that has, in a vacuum processing device that processes a substrate to be processed based on plasma reaction, oxide film layers formed on the surfaces of electrode bodies disposed in a vacuum processing chamber and has alumina sprayed films formed on the oxide film layers so as to be multilayered. According to Patent Literature 1, oxide film layers are protected by alumina sprayed films so as to prevent cracks and peeling-offs of the oxide film layers and generation of particles is prevented, lifetime is lengthened so as to reduce the replacement frequency, and the availability factor of the device is improved.

Patent Literature 2 discloses processing of a member that has an oxidation treatment film formed on a surface of a base material, and anodic oxidation processing that includes, in a manufacturing method of an internal member of a plasma-treated vessel that has a sprayed film formed on the oxidation treatment film, a step of immersing the base material in an alkaline organic solvent and a step of generating plasma discharge in the alkaline organic solvent. Examples of the internal member of a plasma-treated vessel include electrode protecting members and insulating rings. In Patent Literature 2, by performing the processing described above, the adhesiveness of a sprayed film to a surface of a base material is improved.

CITATION LIST

Patent Literature

Patent Literature 1: Japanese Patent Application Laid-open No. 2000-114189
Patent Literature 2: Japanese Patent No. 4430266

SUMMARY

Technical Problem

A member for a plasma processing device needs a high withstand voltage due to high energy in a recent plasm processing step.

In view of the foregoing, an object of the present invention is to provide a member for a plasma processing device having a high withstand voltage.

Solution to Problem

To solve the above-described problem and achieve the object, a member for a plasma processing device according to the present invention includes: an aluminum base material; and an oxide film formed on the aluminum base material and having a porous structure, the oxide film including a first oxide film formed on a surface of the aluminum base material, a second oxide film formed opposite to an aluminum base material side of the first oxide film, and a third oxide film formed opposite to the first oxide film side of the second oxide film, wherein the first oxide film is harder than the second oxide film and the third oxide film, and a hole formed in each of the first oxide film, the second oxide film and the third oxide film is sealed.

Moreover, the above-described member for a plasma processing device according to the present invention includes a ceramic sprayed film formed opposite to the aluminum base material side of the oxide film.

Moreover, in the above-described member for a plasma processing device according to the present invention, the second oxide film becomes harder from the third oxide film toward the first oxide film.

Moreover, in the above-described member for a plasma processing device according to the present invention, the oxide film has porosity of 1% to 2%.

Moreover, in the above-described member for a plasma processing device according to the present invention, the first oxide film includes a barrier layer on a part that contacts the aluminum base material, and the barrier layer has thickness of 80 nm to 210 nm.

Moreover, in the above-described member for a plasma processing device according to the present invention, the oxide film is sealed by hydrated alumina, and the hydrated alumina is hydrate of 1.4 to 2.0.

Moreover, in the above-described member for a plasma processing device according to the present invention, the oxide film has the thickness of 70 μm to 130 μm.

Advantageous Effects of Invention

According to the present invention, a member for a plasma processing device having a high withstand voltage can be implemented.

DESCRIPTION OF EMBODIMENT

An embodiment for implementing the present invention will now be described in detail with reference to the accompanying drawings. It should be noted that the embodiment below is not intended to limit the present invention. Each view referred to in the following description merely illustrates a shape, size, and positional relation schematically to the extent that contents of the present invention can be understood. In other words, the present invention is not limited to only the shape, the size, and the positional relation illustrated in each view.

Figure 1:
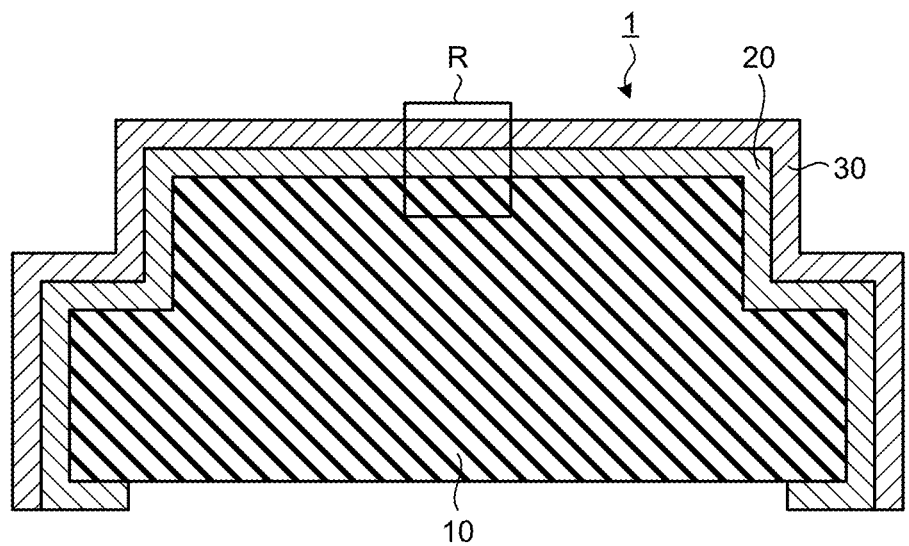
FIG. 1 is a cross-sectional view illustrating the configuration of a member for a plasma processing device in accordance with an embodiment of the present invention.
Figure 2:
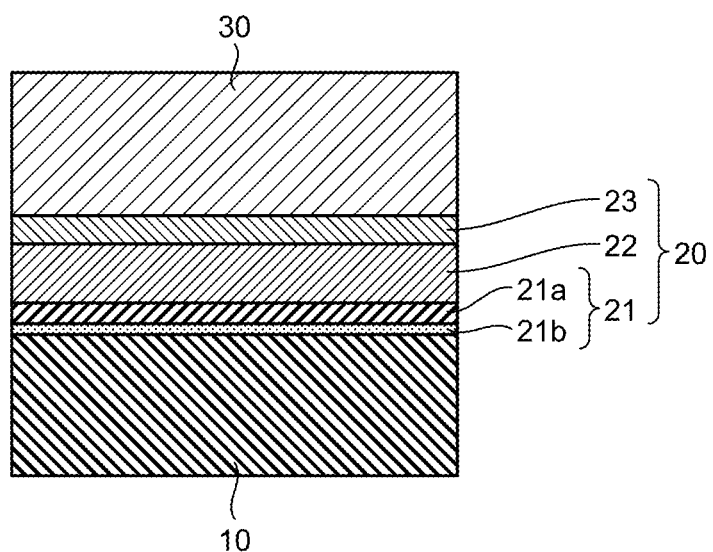
FIG. 2 is a cross-sectional view in which a part of the member for a plasma processing device illustrated in FIG. 1 is enlarged.

FIG. 1 is a cross-sectional view illustrating the configuration of a member for a plasma processing device in accordance with the embodiment of the present invention. FIG. 2 is a cross-sectional view in which a part (area R) of the member for a plasma processing device illustrated in FIG. 1 is enlarged. A member for a plasma processing device 1 illustrated in FIG. 1 includes a base material 10 that is an insulating substrate, an oxide film 20 that is formed on a part of the surface of the base material 10, and a sprayed film 30 that is provided opposite to a base material 10 side of the oxide film 20. The member for a plasma processing device 1 is used as a member used for a plasma processing device, for example, electrodes and materials of electrode protecting members and the like, and is formed by processing and the like of a host material formed of the base material 10, the oxide film 20, and the sprayed film 30.

The base material 10 is an aluminum base material that is formed of aluminum, an alloy mainly consisting of aluminum, or aluminum oxide.

The sprayed film 30 is a ceramic sprayed film formed of ceramic.

Figure 3:
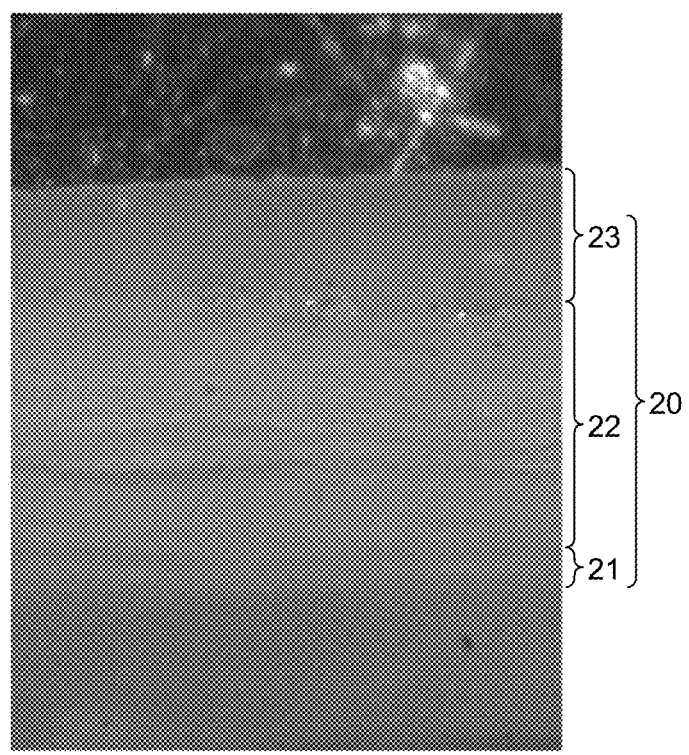
FIG. 3 is a microscope image illustrating an example of an oxide film in the member for a plasma processing device in accordance with the embodiment of the present invention, and the microscope image illustrating a cross-sectional surface of the oxide film.
Figure 4:
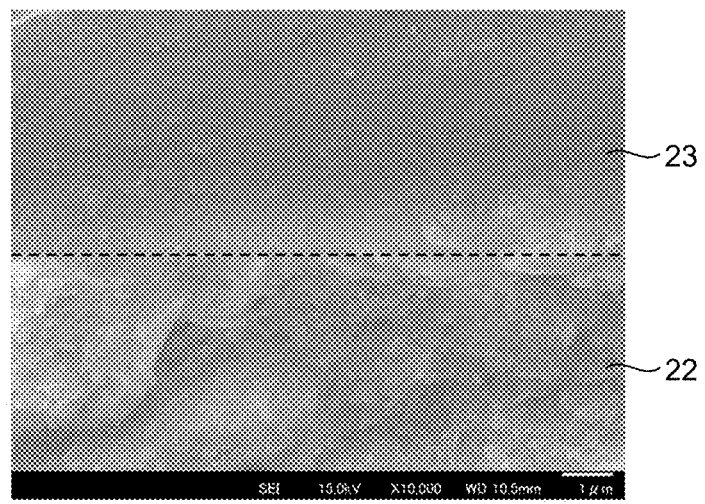
FIG. 4 is a scanning electron microscope (SEM) image illustrating an example of the oxide film in the member for a plasma processing device in accordance with the embodiment of the present invention, and the SEM image illustrating a cross-sectional surface of the oxide film.
Figure 5:
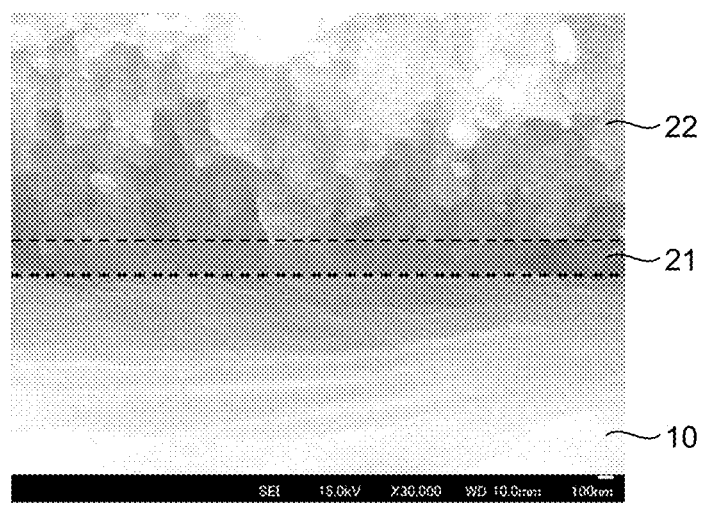
FIG. 5 is an SEM image illustrating an example of the oxide film in the member for a plasma processing device in accordance with the embodiment of the present invention, and the SEM image illustrating a cross-sectional surface of the oxide film.

FIG. 3 is a microscope image illustrating an example of the oxide film in the member for a plasma processing device in accordance with the embodiment of the present invention, and the microscope image illustrating a cross-sectional surface of the oxide film. FIGS. 4 and 5 are scanning electron microscope (SEM) images illustrating examples of the oxide film in the member for a plasma processing device in accordance with the embodiment of the present invention, and the SEM images illustrating cross-sectional surfaces of the oxide film. FIGS. 3 to 5 illustrate an area (film) corresponding to each part in the oxide film illustrated in FIG. 2.

The oxide film 20 is formed of anodic oxide coating, and is an anodic oxide coating formed in three layers. The oxide film 20 is formed of a first oxide film 21 formed on a surface of the base material 10, a second oxide film 22 laminated opposite to the base material 10 side of the first oxide film 21, and a third oxide film 23 laminated opposite to the first oxide film 21 side of the second oxide film 22 (for example, see FIGS. 2 and 3).

The first oxide film 21 has hardness higher than that of the second oxide film 22. The second oxide film 22 has hardness higher than that of the third oxide film 23. In other words, the oxide film 20 has lower hardness from the base material 10 toward the sprayed film 30. The first oxide film 21 preferably has hardness of 400 Hv or more and 430 Hv or less. The second oxide film 22 preferably has hardness of 200 Hv or more and 380 Hv or less. The third oxide film 23 preferably has hardness of 40 Hv or more and 80 Hv or less. The second oxide film 22 has higher hardness from the third oxide film 23 toward the first oxide film 21.

When the first oxide film 21 has hardness of less than 400 Hv, abrasion resistance may be lowered and a withstand voltage may be lowered. When the first oxide film 21 has hardness of more than 430 Hv, cracks may be generated on the first oxide film 21.

In the length of a laminating direction (thickness) of the first oxide film 21, the second oxide film 22, and the third oxide film 23, the second oxide film 22 has the longest length and the first oxide film 21 has the shortest length. Specifically, the first oxide film 21 has a length of 80 nm or more and 210 nm or less. The second oxide film 22 preferably has a length of 60 μm or more and 100 μm or less. The third oxide film 23 has a length of 20 μm or more and 30 μm or less. The oxide film 20 preferably has thickness of 70 μm or more and 130 μm or less, and especially, preferably 70 μm or more and 120 μm or less.

The first oxide film 21 includes a film layer 21a formed on the second oxide film 22 side, and a barrier layer 21b formed on the base material 10 side. The barrier layer 21b is a non-conductive film formed on a surface of the base material, and is the layer supporting the growth of the film during film formation (film layer 21a). The barrier layer 21b preferably has thickness of 80 nm or more and 210 nm or less. In this case, the barrier layer 21b has a content higher than that of the film layer 21a in the first oxide film 21. The conventional barrier layer has, in a film equal to the first oxide film 21, thickness of 30 nm to 40 nm. The film layer 21a and the barrier layer 21b have the same hardness, and preferably have the hardness described above (400 Hv or more and 430 Hv or less).

The oxide film 20 has porosity of 1% or more and 2% or less. In the oxide film 20, the first oxide film 21, the second oxide film 22, and the third oxide film 23 are porous films, and the respective holes of the first oxide film 21, the second oxide film 22, and the third oxide film 23 are filled with hydrated alumina. This hydrated alumina is preferably hydrate of 1.4 or more and 2.0 or less. In the first oxide film 21, the holes described above are formed on the film layer 21a.

A method for manufacturing the member for a plasma processing device 1 will be described. The base material 10 described above is prepared. On this base material 10, the oxide film 20 is formed. When the oxide film 20 is formed, the third oxide film 23 is formed first. After that, the second oxide film 22 is formed. After the second oxide film 22 and the third oxide film 23 are formed, the first oxide film 21 is formed. In this case, on the first oxide film 21, the film layers (the film layer 21a and the barrier layer 21b) are formed by anodic oxidation processing. After that, holes formed in the oxide film 20 are filled with hydrated alumina. In this manner, the oxide film 20 is formed on the base material 10. After that, the sprayed film 30 is formed opposite to the base material 10 side of the oxide film 20.

Figure 6:
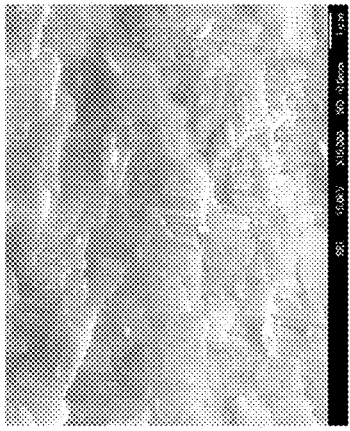
FIG. 6 is a view illustrating physical properties between the member for a plasma processing device in accordance with the embodiment of the present invention and a member for a plasma processing device in accordance with a comparative example.
Figure 6:
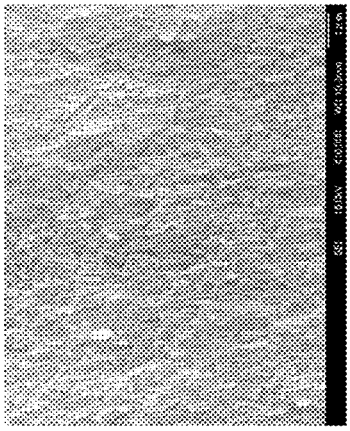

The following describes physical properties between the member for a plasma processing device 1 (example) having a three-layered oxide film manufactured as above and a member for a plasma processing device (comparative example) having a single-layered oxide film with reference to FIG. 6. FIG. 6 is a view illustrating physical properties between the member for a plasma processing device in accordance with the embodiment of the present invention and the member for a plasma processing device in accordance with the comparative example. In FIG. 6, a porous diameter is an average value of diameters of porous holes and the porous number is the number of porous holes.

As illustrated in FIG. 6, it is found that the member for a plasma processing device 1 according to the example either before heating or after heating has a withstand voltage higher than that of the member for a plasma processing device of the comparative example.

The porosity of the member for a plasma processing device 1 according to the example is lower than that of the member for a plasma processing device of the comparative example, and is within the range described above.

According to the embodiment described above, the oxide film 20 formed between the base material 10 and the sprayed film 30 has the three-layered configuration of the first oxide film 21, the second oxide film 22, and the third oxide film 23, and the first oxide film 21 on the base material 10 side is made harder than the other films (the second oxide film 22 and the third oxide film 23), thereby obtaining the member for a plasma processing device having a high withstand voltage.

In this manner, the present invention may include various embodiments and the like that are not described in this specification, and various kinds of design changes and the like can be made without departing from technical ideas specified by the scope of the claims.

In the embodiment described above, the member for a plasma processing device 1 that has the sprayed film 30 formed on the oxide film 20 has been explained as an example, but the member for a plasma processing device may have the configuration where the sprayed film 30 is not included, in other words, may be a member for a plasma processing device formed of the base material 10 and the oxide film 20.

INDUSTRIAL APPLICABILITY

As described above, the member for a plasma processing device according to the present invention is suitable for implementing a member for a plasma processing device having a high withstand voltage.

REFERENCE SIGNS LIST

1 Member for a plasma processing device
10 Base material
20 Oxide film
21 First oxide film
21*a* Film layer
21*b* Barrier layer
22 Second oxide film
23 Third oxide film
30 Sprayed film

The invention claimed is:

1. A member for a plasma processing device comprising:
an aluminum base material; and
an oxide film formed on the aluminum base material and having a porous structure, the oxide film including
a first anodic oxide coating formed on a surface of the aluminum base material,
a second anodic oxide coating formed on the first anodic oxide coating, and
a third anodic oxide coating formed on the second anodic oxide coating,
wherein the first anodic oxide coating is harder than the second anodic oxide coating and the third anodic oxide coating,
a hole formed in each of the first anodic oxide coating, the second anodic oxide coating and the third anodic oxide coating are sealed, and
the first anodic oxide coating includes: a barrier layer on a part that contacts the aluminum base material; and a film layer on a part that contacts the second anodic oxide coating.

2. The member according to claim 1, further comprising a ceramic sprayed film formed on the oxide film.

3. The member according to claim 1, wherein the second anodic oxide coating becomes harder from the third anodic oxide coating toward the first anodic oxide coating.

4. The member according to claim 1, wherein the oxide film has porosity of 1% to 2%.

5. The member according to claim 1, wherein
the barrier layer has a thickness of 80 nm to 210 nm.

6. The member according to claim 1, wherein
the oxide film is sealed by hydrated alumina, and
the hydrated alumina is hydrate of 1.4 to 2.0.

7. The member according to claim 1, wherein the oxide film has a thickness of 70 μm to 130 μm.

* * * * *